(12) United States Patent
Schneider et al.

(10) Patent No.: US 12,414,387 B2
(45) Date of Patent: Sep. 9, 2025

(54) PHOTOCONDUCTIVE SWITCH WITH DIAMOND

(71) Applicant: Lawrence Livermore National Security, LLC, Livermore, CA (US)

(72) Inventors: Joseph Devin Schneider, Danville, CA (US); Lars F. Voss, Livermore, CA (US); Noah Patrick Allen, Oakland, CA (US); Caitlin Anne Chapin, Fremont, CA (US); Laura Leos, Livermore, CA (US); Alexander Peter Povilus, Livermore, CA (US); Sara Harrison, Livermore, CA (US); John Berns Lancaster, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 24 days.

(21) Appl. No.: 18/396,223

(22) Filed: Dec. 26, 2023

(65) Prior Publication Data
US 2024/0222541 A1 Jul. 4, 2024

Related U.S. Application Data

(60) Provisional application No. 63/477,946, filed on Dec. 30, 2022.

(51) Int. Cl.
*H01L 31/09* (2006.01)
*H01L 31/0224* (2006.01)
*H01L 31/0232* (2014.01)
*H01L 31/0288* (2006.01)

(52) U.S. Cl.
CPC ...... *H01L 31/09* (2013.01); *H01L 31/022466* (2013.01); *H01L 31/02327* (2013.01); *H01L 31/0288* (2013.01)

(58) Field of Classification Search
CPC ............ H01L 31/09; H01L 31/022466; H01L 31/0288
See application file for complete search history.

(56) References Cited

U.S. PATENT DOCUMENTS

2008/0203397 A1* 8/2008 Amaratunga ......... H01L 31/118
257/77
2018/0013028 A1* 1/2018 Nelson .................. H03K 17/78

OTHER PUBLICATIONS

Beetz et al., "Nitrogen Laser Photoconductive Switching Of Semiconducting Diamond", LEOS '92 Conference Proceedings, 1992, p. 154-155. (Year: 1992).*

(Continued)

*Primary Examiner* — Thanh Luu
(74) *Attorney, Agent, or Firm* — Perkins Coie LLP (57) ABSTRACT

Devices, methods and techniques related to photoconductive switches using diamond are disclosed. In one example aspect, a photoconductive apparatus includes a diamond layer positioned to receive a light. The diamond layer is doped with nitrogen. The apparatus also includes a first electrode coupled to the diamond layer to provide a first electrical contact for the diamond layer, and a second electrode coupled to the diamond layer to provide a second electrical contact for the diamond layer and configured to reflect the light back to the diamond layer. The first electrode and the second electrode are configured to establish an electric field across the diamond layer in response to receiving the light.

23 Claims, 6 Drawing Sheets

(56) References Cited

OTHER PUBLICATIONS

C. Masante et al, "Non-volatile photo-switch using a diamond pn junction," Adv. Electron. Mater. 2022, 8, 2100542.
N Donato et al, "Diamond power devices: state of the art, modelling, figures of merit and future perspective," J. Phys. D: Appl. Phys. 53 (2020) 093001.

* cited by examiner

PHOTOCONDUCTIVE SWITCH WITH DIAMOND

CROSS REFERENCE TO RELATED APPLICATIONS

This patent document claims priority to and benefits of U.S. Provisional Patent Application No. 63/477,946 entitled "PHOTOCONDUCTIVE SWITCH WITH DIAMOND" and filed on Dec. 30, 2022. The entire contents of the before-mentioned patent application are incorporated by reference as part of the disclosure of this patent document

STATEMENT REGARDING FEDERALLY SPONSORED RESEARCH OR DEVELOPMENT

This invention was made with Government support under Contract No. DE-AC52-07NA27344 awarded by the United States Department of Energy. The Government has certain rights in the invention.

TECHNICAL FIELD

This document generally relates to photoconductive switches, and more specifically, photoconductive switches using doped diamond.

BACKGROUND

High frequency switches are widely used for many applications including inverters, pulsed power, and generation of electromagnetic waves.

SUMMARY

This patent document describes, among other things, techniques related to diamond photoconductive switches with increased efficiency and power handling capability.

In one example aspect, a photoconductive device includes a first electrode configured as a first electrical contact, a second electrode configured as a second electrical contact, and a region comprising a doped diamond material positioned between the first electrode and the second electrode. The region comprising the doped diamond material is configured to receive light from a light source operable at a wavelength in a range from 300 nm to 450 nm. The doped diamond material includes nitrogen as a dopant. The first electrode and the second electrode are configured to establish an electric field across the region comprising the doped diamond material such that the region becomes conductive in response to receiving the light from the light source.

In another example aspect, a method for operating a photoconductive switch includes operating a light source capable of producing light at a wavelength between 300 to 450 mn, directing the light to a diamond layer of the photoconductive switch, and establishing an electric field across the diamond layer in response to the light from the light source. The photoconductive switch comprises a first electrode coupled to the diamond layer to provide a first electrical contact for the diamond layer and a second electrode coupled to the diamond layer to provide a second electrical contact for the diamond layer.

DETAILED DESCRIPTION

Photoconductive Semiconductor Switch (PCSS) is a type of optoelectronic devices that can exhibit extremely fast risetimes and high-power handling capability. Pulsed power and radiofrequency generation using PCSS have been demonstrated at high power using materials such as silicon, gallium, arsenide, silicon carbide (SiC), gallium nitride, (GaN), and other semiconductors.

Diamond has been explored extensively for high power electronics due to its superior breakdown field, high carrier mobility, thermal conductivity, and radiation hardness. The implementation of diamond PCSS requires control of carrier generation (which governs the wavelength and required power of the input optical source) and recombination (which determines the attainable switching frequency). Lifetimes in diamond can be reduced by utilizing defects or impurities that modulate generation and recombination so as to produce extrinsic photoconductivity. Synthetic diamond with high levels of incorporated impurities (e.g., nitrogen) can be considered as an alternative and attractive candidate for PCSS.

This patent document discloses techniques that can be implemented in various embodiments for the use and construction of a diamond photoconductive switch that increases efficiency and power handling. The disclosed techniques can be implemented to build efficient, high power diamond photoconductive switches including selection of wavelength and selection of anode and cathode materials.

Figure 1A:
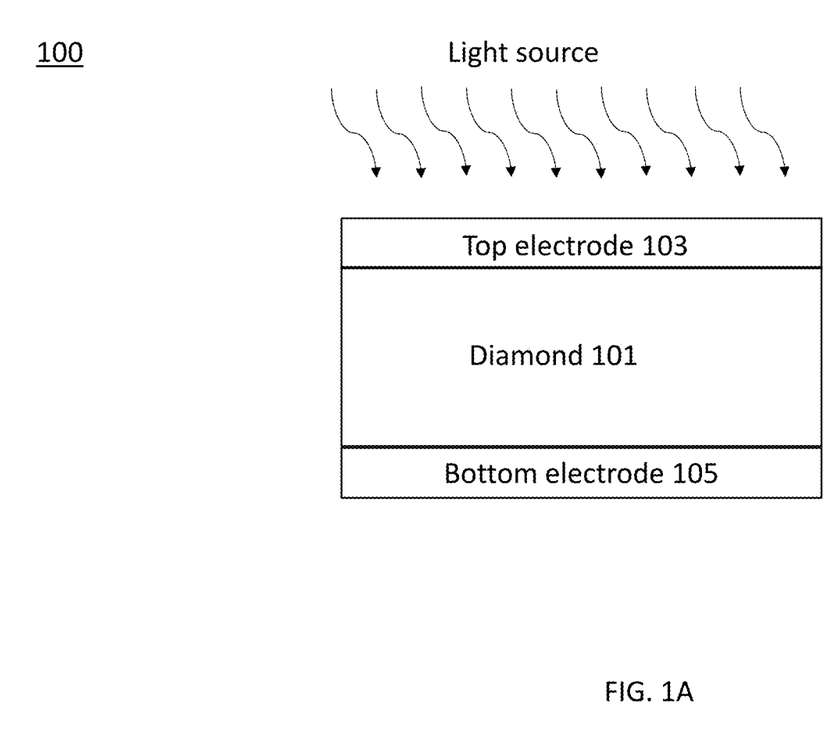
FIG. 1A illustrates an example of a photoconductive switch in accordance with one or more embodiments of the present technology.

FIG. 1A illustrates an example of a photoconductive switch in accordance with one or more embodiments of the present technology. The diamond switch 100 includes a top electrode 103. In some embodiments, the top electrode 103 comprises an ultra-wide band gap (UWBG) transparent material, such as gallium oxide ($Ga_2O_3$). The diamond switch 100 also includes a bottom electrode 105. In some embodiments, the bottom electrode 105 also comprises an ultra-wide band gap (UWBG) transparent material, such as $Ga_2O_3$. In some embodiments, the bottom electrode 105 comprises a highly reflecting layer. The reflecting layer can be made of metal (e.g., aluminum) or another UWBG transparent conductor with a dielectric mirror. The diamond switch further comprises a diamond layer 101 that is doped with a dopant (e.g., nitrogen or substitutional nitrogen) to act as a source of electrons and/or holes. The photoconductive switch is positioned to receive and to be illuminated (in the depicted configuration, from the top) by a light from a light source operable at a wavelength that is between 250 and 470 nm to maximize optical efficiency. In some embodiments, the wavelength is between 300 to 450 nm to provide desired optical efficiency.

The design and construction of a photoconductive switch include considerations regarding the selection of an appropriate material, the selection of an appropriate excitation wavelength, the selection of a device architecture, and the selection of electrode materials.

Regarding the selection of material, a dopant at a certain concentration level can be selected as a deep level donor and source of electrons and/or holes for excitation, so that free carriers can be generated using below band gap light. In some embodiments, nitrogen can be used as the dopant for the diamond material. The selected concentration of nitrogen ranges from $1 \times 10^{15}$ cm$^{-3}$ to $1 \times 1^{20}$ cm$^{-3}$. The value chosen is dependent on the end-use applications. Higher doping levels allow higher switch opening speed, while lower doping levels allow for reduced light intensity.

The thickness of the diamond can be chosen to closely match the absorption coefficient of the pump wavelength. The absorption coefficient is dependent on doping density. For higher doping densities, the absorption coefficient is higher. In some embodiments, it is desirable to choose a total absorption thickness to absorb between 25% and 100% of incident light. The absorption thickness is equal to the device thickness in the case where transparent electrodes are used on both surfaces, or twice the device thickness when the bottom electrode is a mirror. As an example, for an absorption coefficient of 70 cm$^{-1}$, approximately 50% of the incident light is absorbed through a 100 micron path length. Correspondingly, the minimum thickness is on the order of 33 microns in this case.

In some embodiments, to improve voltage handling capability (e.g., to increase voltage hold off), the center of the diamond can be thinner than the edges of the device, thereby creating a longer distance for surface tracking. The uneven surface shape of the diamond can create stepped edges that increase voltage handling capability. A thick diamond plate can be thinned down by laser ablation, milling, or etching. The thickness of the thinned area depends on the original thickness of the diamond plate and is tailorable based on the desired voltage handling capability. In some embodiments, the thickness of the thinned area can be in a range of 5 to 400 microns. In some embodiments, the diamond is only thinned out in the center with a predetermined diameter, leaving the rest of the diamond the original thickness. The diameter can be determined based on the desired speed of the switch. Due to the capacitance effect of the diamond, the smaller the diameter, the faster the switch. For example, a diameter of 0.5 millimeter can lead to sub-Pico second switching speed, while a diameter of 4 millimeter can result in a switching speed of 10s of nanoseconds or even in the microsecond range.

Figure 2:
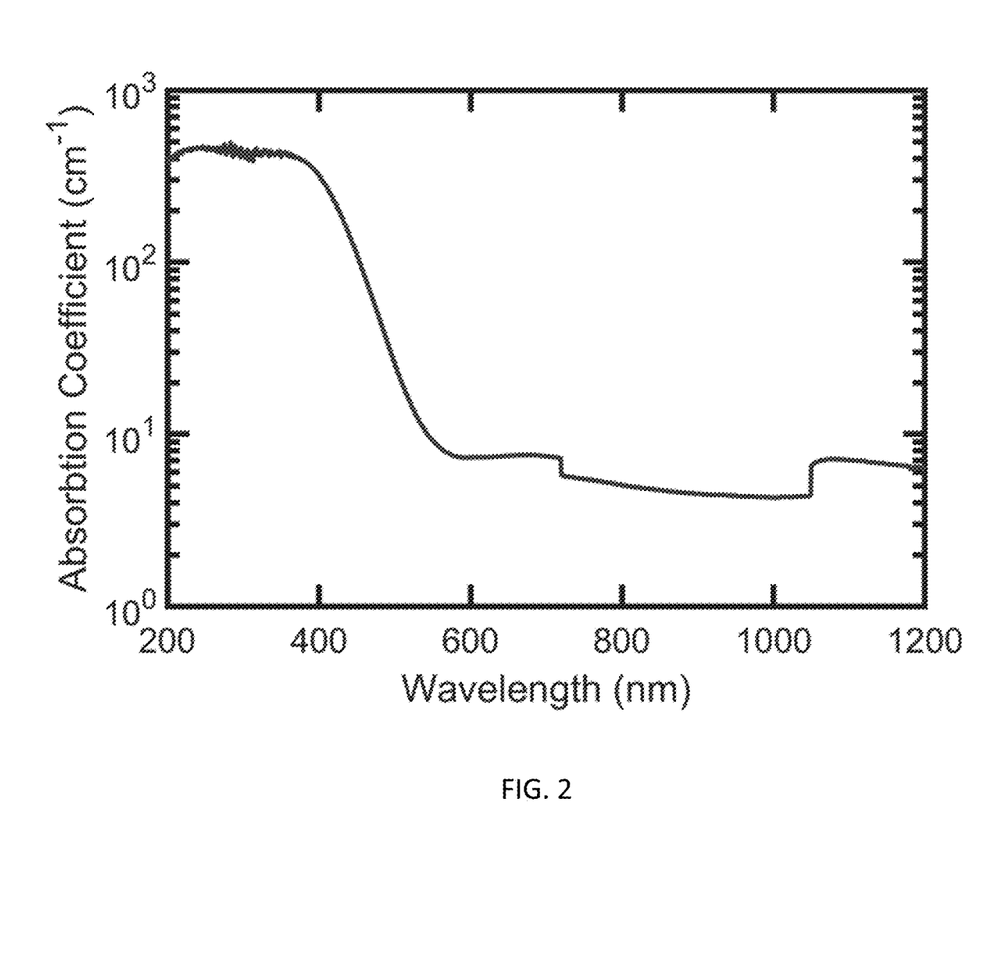
FIG. 2 illustrates an example plot illustrating a change of the optical absorption coefficient in response to the wavelength.

Regarding the selection of the excitation wavelength, the wavelength range of the light can be between 300-470 nm or between 300-450 nm. In some embodiments, the wavelength range can be between 200-532 nm. At shorter wavelengths, photon recycling increases the diamonds responsivity. Specifically, an incident photon excites and electron into a conduction band. As the electron returns to its deep level a photon is emitted and reabsorbed, thus, exciting another electron into the conduction band. This increases the switching responsivity enabling higher output power. FIG. 2 is an example plot illustrating the change in optical absorption coefficient of diamond in response to wavelength. As shown in FIG. 2, an onset of absorption begins around 532 nm, rapidly increasing from a minimum of ~2.5 cm$^{-1}$ to around 80 cm$^{-1}$ at around 400 nm. Therefore, the selected range between 200-532 nm (preferably, 300-470 nm or 300-450 nm) can result in an absorption coefficient that is unusually high for a below-bandgap excitation. These wavelengths are also readily available both in the form of blue and/or ultraviolet light, e.g., laser diodes (AlGaN) and tripled harmonic Nd:YAG lasers (355 nm).

Figure 1B:
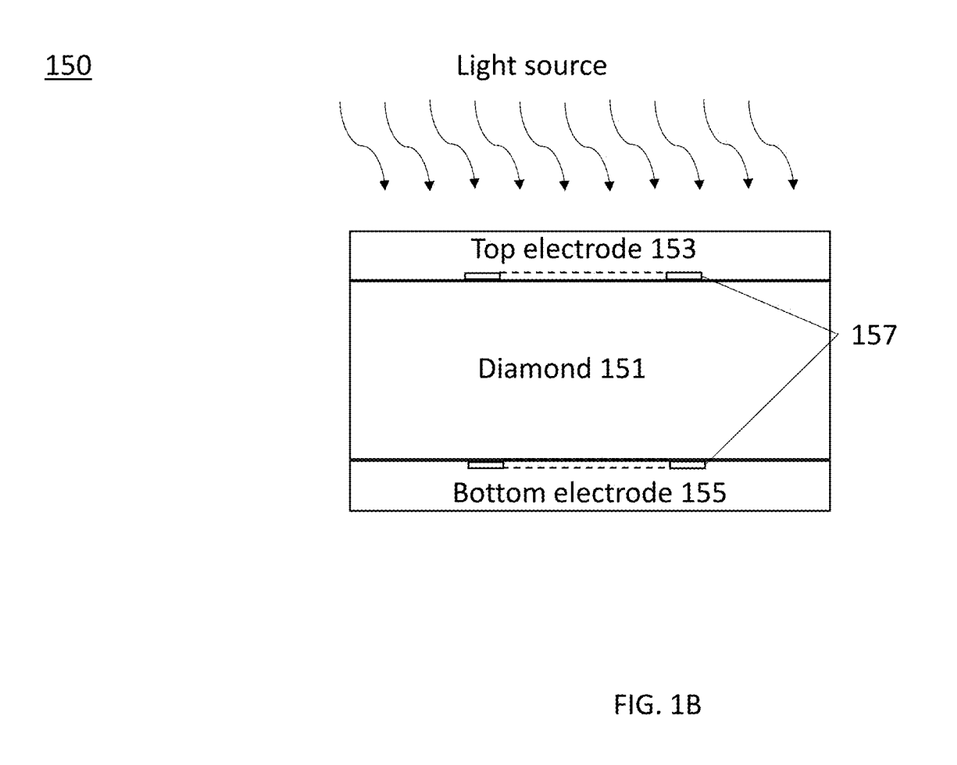
FIG. 1B illustrates another example of a photoconductive switch in accordance with one or more embodiments of the present technology.

Regarding the selection of the device architecture, in some embodiments, an axial configuration as shown in FIG. 1A and/or FIG. 1B can be used to allow the light to enter through the top electrode via an open aperture. The high absorption coefficient achieved by the combination of the diamond layer and the excitation wavelength enables efficient conversion of light to electrons in this configuration. Alternative configurations can also be adopted.

Regarding the selection of the electrode materials, the top electrode material (or one side electrode material) can comprise a UWBG material, such as Ga2O3. Having two transparent electrodes enables double sided illumination, thereby increasing the uniformity of the conductivity through the thickness while also enabling higher output power. Traditional transparent conducting oxides such as Indium Tin Oxide or Aluminum Zinc Oxide can absorb too much light, particularly in the UV region of the spectrum, resulting in high absorption rate of the light having wavelength in 300-470 nm range. The use of the UWBG conductor can minimize absorption of the light in other materials and maximize the amount of light enters the diamond layer. The UWBG material can also withstand higher optical intensities before undergoing damage, which enables higher power. The thickness of the UWBG material can be chosen to minimize reflection and maximize transmission. The specific thickness is determined by the refractive indices of the substrates and all coating layers. As an example, at 355 nm, the thickness of an indium tin oxide (ITO) can be approximately 140 nm. In some embodiments, the UWBG material can be doped N type or P type, or doped to be conductive so as to form a UWBG conductor.

In some embodiments, an annulus of metal outside of the illumination region can be used to provide a solderable or contactable interface. FIG. 1B illustrates another example of a photoconductive switch in accordance with one or more embodiments of the present technology. The diamond switch 150 includes a top electrode 153 and a bottom electrode 155. The diamond switch comprises a diamond layer 151 that is doped with a dopant (e.g., nitrogen or substitutional nitrogen) to act as a source of electrons and/or holes. FIG. 1B also illustrates a side view of one or more metal rings 157 for soldering connection. The metal ring(s) are positioned outside of the illumination region to provide a solderable or contactable interface.

Figure 3:
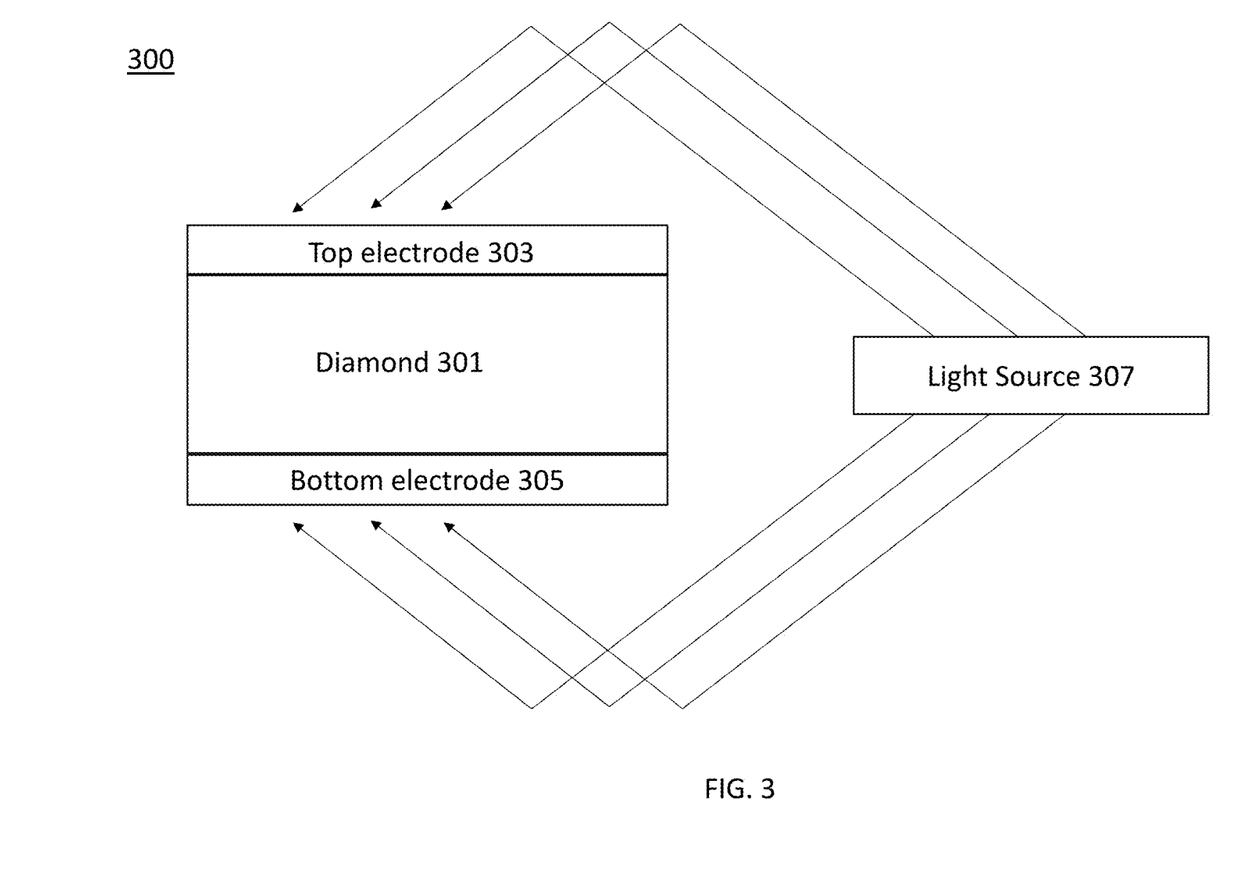
FIG. 3 illustrates an example configuration of double-sided illumination in accordance with one or more embodiments of the present technology.

In some embodiments, double-sided illumination to both the top and bottom electrode materials can optimize the absorption of light in thicker devices. FIG. 3 illustrates an example configuration 300 of double-sided illumination in accordance with one or more embodiments of the present technology. As shown in FIG. 3, in some embodiments, the light 307 is split into two paths and then sent to the two sides of the device: the top electrode 303 and the bottom electrode 305 respectively. Having two paths of light from the same light source creates a uniform conductivity profile inside of the diamond layer 301, resulting in a more robust architecture while also enabling higher output power. In some embodiments, the top and bottom electrodes include transparent conductors with a respective annulus of metal outside of the illumination region to provide a solderable or contactable interface (e.g., as shown in FIG. 1B).

In some embodiments, the top and bottom electrodes can be chosen to maximize reflectivity in order to further reduce losses and increase maximum power. In most PCSS, silver (Ag) is chosen due to best reflectivity. However, for light having a wavelength below 500 nm, aluminum (Al) has shown superior reflectivity performance at a lower cost. The electrodes can also be an UWBG transparent material with a dielectric mirror deposited on it to maximize reflectivity. In some embodiments, a multi-layer dielectric material, such as silver and silicon nitride, can be used.

Figure 4:
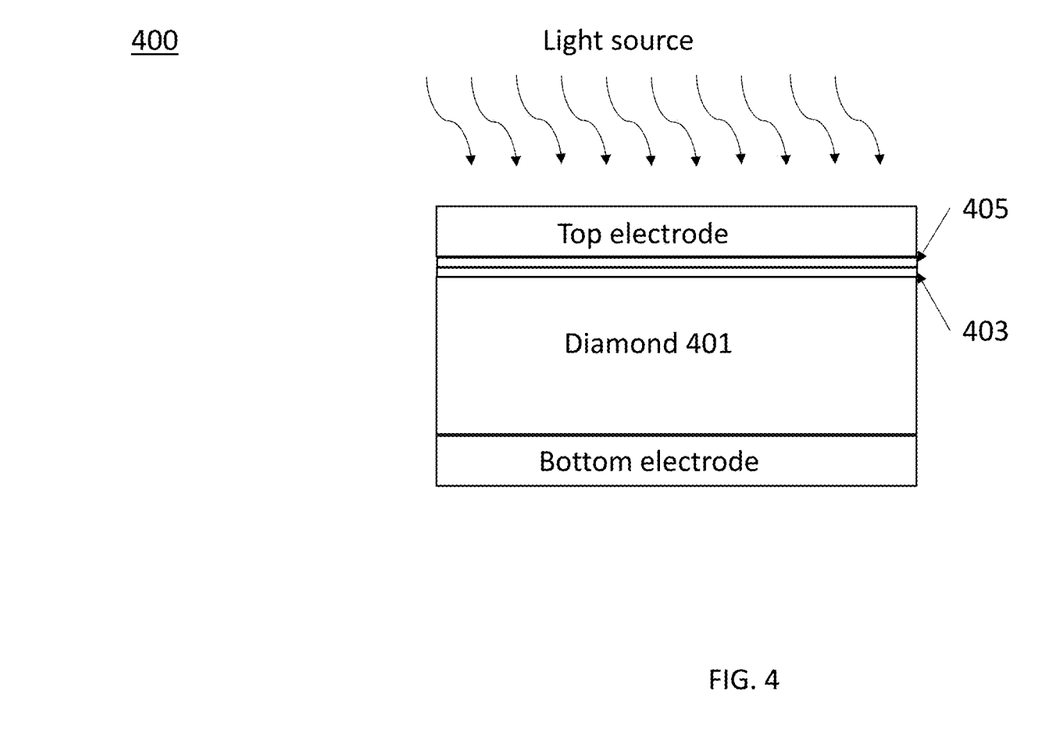
FIG. 4 illustrates an example configuration using a combination of a patterned conductive structure and a patterned anti-reflective layer in accordance with one or more embodiments of the present technology.

In some embodiments, to improve power efficiency of the diamond photoconductive semiconducting switch, a patterned optical structure can be provided to alter interaction between a photoexcitation source and the device such that photoconductivity is enhanced, and power efficiency is increased. In some embodiments, a patterned conductive structure can be provided to enhance conductivity of the diamond, thereby increasing power efficiency. In some embodiments, an electrically conductive structure (e.g., a metal grid, a conductive lattice or mesh, etc.) can be grown or deposited on the diamond switch. In some embodiments, an electrically conductive yet optically transparent patterned region can be deposited or grown on the diamond switch. In some embodiments, a layer of electrically conductive material that is thin enough to be optically transparent can be created on the surface. In some embodiments, a patterned anti-reflective layer can be provided on diamond. The patterned anti-reflective layer (e.g., an anti-reflective grid) can be provided individually or in combination with the patterned optical/conductive structure. FIG. 4 illustrates an example configuration 400 using a combination of a patterned conductive structure 403 (e.g., metal grid) and a patterned anti-reflective layer 405 (e.g., an anti-reflective grid) to improve conductivity of the diamond 401 and increase absorption of the light of the diamond 401.

Figure 5:
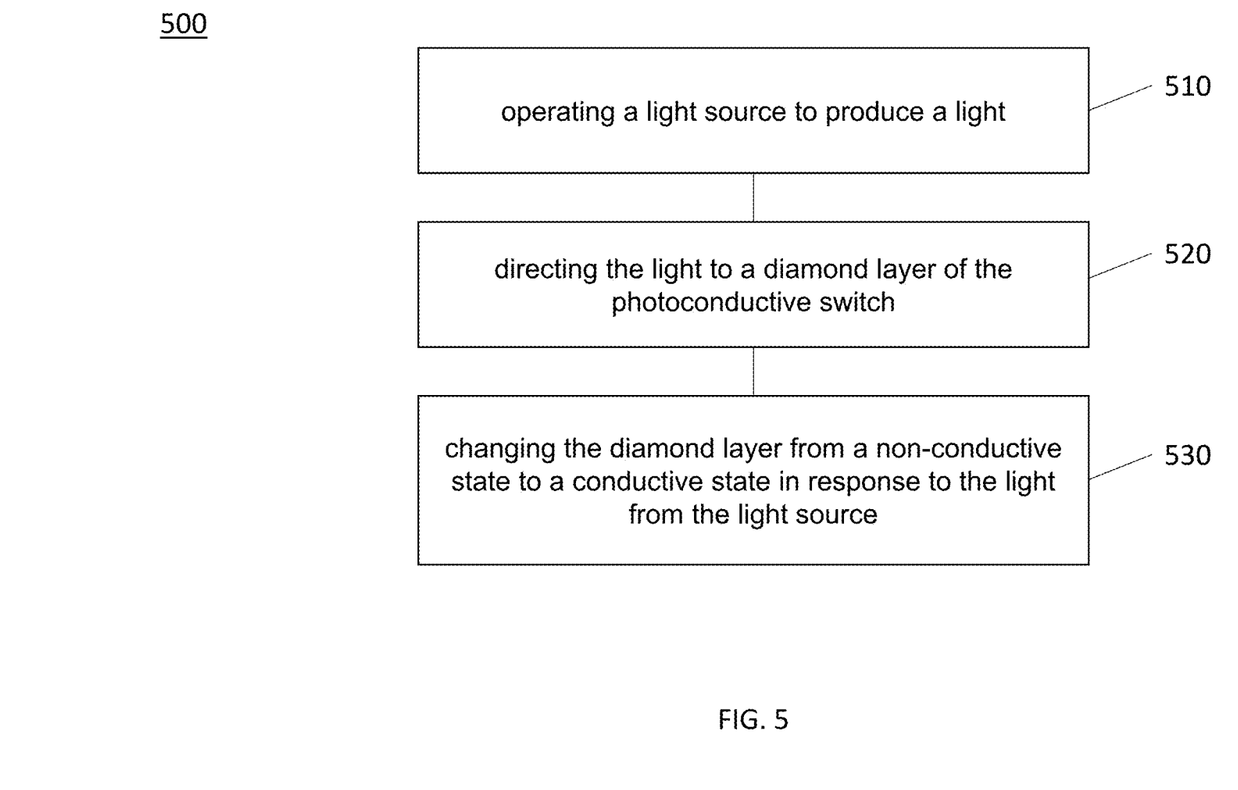
FIG. 5 is a flowchart representation of a method for in accordance with one or more embodiments of the present technology.

FIG. 5 is a flowchart representation of a method 500 for operating a photoconductive switch in accordance with one or more embodiments of the present technology. The method 500 includes, at operation 510, operating a light source capable of producing light at a particular wavelength or a range of wavelengths. The method 500 includes, at operation 520, directing the light to a diamond layer of the photoconductive switch. The photoconductive switch further comprises a first electrode coupled to the diamond layer to provide a first electrical contact for the diamond layer and a second electrode coupled to the diamond layer to provide a second electrical contact for the diamond layer. The diamond layer doped with a dopant (e.g., nitrogen) to produce impurities that enable the modulation of recombination time and increase the efficiency and power handling of the switch. The method 500 includes, at operation 530, changing the diamond layer from a non-conductive state to a conductive state in response to the light from the light source. Due to the change of the state of the diamond layer, a voltage pulse is generated from an electric field established previously across the diamond layer.

In some embodiments, the light has a wavelength between 300 to 470 mn, such as a blue light or an ultraviolet light. In some embodiments, the diamond layer is doped with a nitrogen at a concentration level that ranges from $1\times10^{15}$ $cm^{-3}$ to $1\times1^{20}$ $cm^{-3}$. In some embodiments, the first electrode comprises an ultra-wide bandgap material. The second electrode can comprise aluminum or an ultra-wide bandgap material with a mirror configured to reflect the light. The disclosed techniques can enable maximum quantum efficiency of a photoconductive switch with diamond by minimizing absorption in materials other than the diamond photoconductor, so that the diamond switch can operate in the region of desired absorption while still being accessible with common optical sources. The disclosed techniques can also maximize optical intensity through the use of optically resilient materials.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described, and other implementations, enhancements and variations can be made based on what is described and illustrated in this patent document.

What is claimed is:

1. A photoconductive device, comprising:
    a first electrode configured as a first electrical contact;
    a second electrode configured as a second electrical contact; and
    a region comprising a doped diamond material positioned between the first electrode and the second electrode, wherein a center of the doped diamond material has a smaller thickness as compared to an edge of the doped diamond material, wherein:
    the region comprising the doped diamond material is configured to receive light from a light source operable at a wavelength in a range from 300 nm to 450 nm,
    the doped diamond material includes nitrogen as a dopant, and
    the first electrode and the second electrode are configured to establish an electric field across the region comprising the doped diamond material such that the region becomes conductive in response to receiving the light from the light source.

2. The photoconductive device of claim 1, wherein the first electrode is configured as a top electrode to allow the light to reach the region comprising the doped diamond material, and the second electrode is configured as a bottom electrode and includes a material that is reflective at a wavelength of the light that enters the doped diamond material and travels to the bottom electrode.

3. The photoconductive device of claim 1, wherein the light from the light source is split into two paths, and wherein the region comprising the doped diamond material is configured to receive the two paths of the light from a first side of the doped diamond material and a second side of the doped diamond material respectively.

4. The photoconductive device of claim 1, wherein the light comprises a blue light or an ultraviolet light.

5. The photoconductive device of claim 1, wherein the doped diamond material is doped with nitrogen at a concentration level that ranges from $1 \times 10^{15}$ cm$^{-3}$ to $1 \times 10^{20}$ cm$^{-3}$.

6. The photoconductive device of claim 1, wherein at least one of the first electrode or the second electrode comprises an ultra-wide bandgap transparent material.

7. The photoconductive device of claim 6, wherein the ultra-wide bandgap transparent material comprises gallium oxide.

8. The photoconductive device of claim 6, wherein the ultra-wide bandgap transparent material is doped to be conductive.

9. The photoconductive device of claim 1, wherein at least one of the first electrode or the second electrode comprises an open aperture that allows the light to enter the region comprising the doped diamond material.

10. The photoconductive device of claim 1, further comprising:
    an annulus of metal positioned outside of a region through which the light enters the region comprising the doped diamond material.

11. The photoconductive device of claim 1, wherein at least one of the first electrode or the second electrode comprises an ultra-wide bandgap transparent material with a mirror configured to reflect the light.

12. The photoconductive device of claim 1, comprising:
    a patterned layer of material positioned on the doped diamond material, wherein the patterned layer is electrically conductive and optically transparent.

13. The photoconductive device of claim 12, wherein the patterned layer comprises a metal grid.

14. A method for operating a photoconductive switch, comprising:
    operating a light source capable of producing light at a wavelength between 300 to 450 nm;
    directing the light to a diamond layer of the photoconductive switch by splitting the light into two paths, wherein the diamond layer is configured to receive the two paths of the light from a first side of the diamond layer and a second side of the diamond layer respectively, wherein the photoconductive switch further comprises a first electrode coupled to the diamond layer to provide a first electrical contact for the diamond layer and a second electrode coupled to the diamond layer to provide a second electrical contact for the diamond layer; and
    changing the diamond layer from a non-conductive state to a conductive state in response to the light from the light source.

15. The method of claim 14, wherein the light comprises a blue light or an ultraviolet light.

16. The method of claim 14, wherein the diamond layer is doped with a nitrogen at a concentration level that ranges from $1 \times 10^{15}$ cm$^{-3}$ to $1 \times 10^{20}$ cm$^{-3}$.

17. The method of claim 14, wherein at least one of the first electrode or the second electrode comprises an ultra-wide bandgap material.

18. The method of claim 14, wherein a center of the diamond layer has a smaller thickness as compared to an edge of the diamond layer.

19. The method of claim 14, wherein the diamond layer comprises a patterned layer that is electrically conductive and optically transparent.

20. A photoconductive device, comprising:
    a first electrode configured as a first electrical contact;
    a second electrode configured as a second electrical contact; and
    a region comprising a doped diamond material positioned between the first electrode and the second electrode, wherein:
    the region comprising the doped diamond material is configured to receive light from a light source operable at a wavelength in a range from 300 nm to 450 nm,
    the doped diamond material includes nitrogen as a dopant, and
    the first electrode and the second electrode are configured to establish an electric field across the region comprising the doped diamond material such that the region becomes conductive in response to receiving the light from the light source,
    wherein at least one of the first electrode or the second electrode comprises an ultra-wide bandgap transparent material that is doped to be conductive.

21. The photoconductive device of claim 20, wherein the ultra-wide bandgap transparent material comprises gallium oxide.

22. A photoconductive device, comprising:
    a first electrode configured as a first electrical contact;
    a second electrode configured as a second electrical contact;
    a region comprising a doped diamond material positioned between the first electrode and the second electrode; and
    a patterned layer of material positioned on the doped diamond material, wherein the patterned layer is electrically conductive and optically transparent,
    wherein the region comprising the doped diamond material is configured to receive light from a light source operable at a wavelength in a range from 300 nm to 450 nm,
    wherein the doped diamond material includes nitrogen as a dopant, and
    wherein the first electrode and the second electrode are configured to establish an electric field across the region comprising the doped diamond material such that the region becomes conductive in response to receiving the light from the light source.

23. The photoconductive device of claim 22, wherein the patterned layer comprises a metal grid.

* * * * *